(12) United States Patent
Tsutsui et al.

(10) Patent No.: US 8,753,908 B2
(45) Date of Patent: Jun. 17, 2014

(54) METHOD OF MANUFACTURING SEMICONDUCTOR LIGHT EMITTING DEVICE

(75) Inventors: Tsuyoshi Tsutsui, Gyeonggi-do (KR); Shin Kun Kim, Gyeonggi-do (KR); Seong Jae Hong, Gyeonggi-do (KR); Il Woo Park, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/541,248

(22) Filed: Jul. 3, 2012

(65) Prior Publication Data
US 2013/0011948 A1 Jan. 10, 2013

(30) Foreign Application Priority Data
Jul. 6, 2011 (KR) ................. 10-2011-0066640

(51) Int. Cl.
*H01L 33/50* (2010.01)
(52) U.S. Cl.
USPC ................. 438/33; 438/34; 257/E33.061
(58) Field of Classification Search
USPC ................. 438/33, 34; 257/E33.061
See application file for complete search history.

(56) References Cited

U.S. PATENT DOCUMENTS

| 7,049,159 B2* | 5/2006 | Lowery ..................... 438/33 |
| 2007/0099325 A1* | 5/2007 | Park ........................ 438/33 |
| 2007/0169646 A1* | 7/2007 | Seo et al. ................. 101/211 |
| 2007/0217008 A1* | 9/2007 | Wang et al. ............... 359/486 |
| 2012/0142124 A1* | 6/2012 | Yoo et al. ............. 257/E33.061 |
| 2012/0252145 A1* | 10/2012 | Yoo et al. ................. 438/29 |

FOREIGN PATENT DOCUMENTS

| JP | 2002-141365 | 5/2002 |
| JP | 2005-032682 | 2/2005 |
| KR | 10-0797710 B1 | 1/2008 |

\* cited by examiner

*Primary Examiner* — Mary Wilczewski
*Assistant Examiner* — Toniae Thomas

(57) ABSTRACT

There are disclosed a method of manufacturing a semiconductor light emitting device and a paste application apparatus. The method includes preparing a light emitting structure including a first conductive semiconductor layer, an active layer, and a second conductive semiconductor layer; disposing a mask including an opening exposing a part of the light emitting structure on the light emitting structure; applying a paste including a wavelength conversion material to the light emitting structure through the opening of the mask, by using a pressure means; and planarizing the applied paste by using a roller.

13 Claims, 8 Drawing Sheets

METHOD OF MANUFACTURING SEMICONDUCTOR LIGHT EMITTING DEVICE

CROSS-REFERENCE TO RELATED APPLICATIONS

This application claims the priority of Korean Patent Application No. 10-2011-0066640 filed on Jul. 6, 2011, in the Korean Intellectual Property Office, the disclosure of which is incorporated herein by reference.

BACKGROUND OF THE INVENTION

1. Field of the Invention

The present invention relates to a method of manufacturing a semiconductor light emitting device and a paste application apparatus used for the same.

2. Description of the Related Art

In general, a light emitting diode is a device used in transmitting a signal formed by converting electrical energy into light, such as infrared light or light within the visible spectrum, by using the characteristics of a compound semiconductor. A light emitting diode utilizes electroluminescence (EL), and currently, a light emitting diode using a group III-☐ compound semiconductor has been practically used. A group III nitride compound semiconductor, a direct transition type semiconductor, may be more stably operated in high temperature conditions than a device using other semiconductors, and thus has been widely used in a light emitting device, such as a light emitting diode (LED), a laser diode (LD) or the like.

The respective chips configuring the light emitting device maybe formed by growing a semiconductor layer on a single wafer and then separating the wafer into unit chips through a cutting process. A process of forming a fluorescent layer including fluorescent substance particles for wavelength conversion on an upper surface of each separated unit chip is separately undertaken. In this case, the process of forming a fluorescent layer on an upper surface of each unit chip may be performed through screen printing, compression molding, spin coating, spray coating, a deposition operation, or the like. Precision in the process of forming a fluorescent layer may significantly affect light uniformity of a semiconductor light emitting device.

SUMMARY OF THE INVENTION

An aspect of the present invention provides a method of manufacturing a semiconductor light emitting device having improved chromaticity and light uniformity.

An aspect of the present invention also provides a method of manufacturing a semiconductor light emitting device having improved processing efficiency.

An aspect of the present invention also provides a paste application apparatus capable of manufacturing the semiconductor light emitting device having improved chromaticity and light uniformity.

According to an aspect of the present invention, there is provided a method of manufacturing a semiconductor light emitting device, the method including: preparing a light emitting structure including a first conductive semiconductor layer, an active layer, and a second conductive semiconductor layer; disposing a mask including an opening exposing a part of the light emitting structure on the light emitting structure; applying a paste including a wavelength conversion material to the light emitting structure through the opening of the mask, by using a pressure means; and planarizing the applied paste by using a roller.

In the applying of the paste, the pressure means may be a squeegee pushing the paste horizontally.

In the applying of the paste and the planarizing of the applied paste, the pressure means and the roller may move horizontally on the light emitting structure in opposite directions.

The roller may include prominences and depressions formed on a surface thereof, and in the planarizing of the applied paste, prominences and depressions may be formed on a surface of the applied paste by the prominences and depressions formed on the surface of the roller.

The prominences and depressions formed on the surface of the roller may have a size of several nanometers (nm) to several micrometers (μm).

A radius r of the roller may satisfy $$r \geq \frac{l}{2\pi},$$

provided that a radius of the roller is r and a maximum width of an upper surface of the light emitting structure to which the paste is applied is l.

The opening may be provided in plural, and unit device areas formed by a separation of the light emitting structure may be exposed through the plurality of openings.

The applying of the paste may be performed by a screen printing method.

The method may further include forming the light emitting structure by sequentially stacking the first conductive semiconductor layer, the active layer, and the second conductive semiconductor layer on a wafer.

The method may further include separating the light emitting structure into unit devices to generate a plurality of light emitting devices.

In this case, the separating of the light emitting structure into unit devices to generate a plurality of light emitting devices, may be performed before the applying of the paste or after the applying of the paste.

The paste maybe exposed through sides of the plurality of light emitting devices generated by separating the light emitting structure into unit devices.

The paste may include at least one of fluorescent substance particles and quantum dots.

According to another aspect of the present invention, there is provided a paste application apparatus, including: a supporting means having a light emitting structure disposed on an upper surface thereof; a movement means disposed above the supporting means to be spaced apart therefrom and moving horizontally on the light emitting structure; a pressure means connected to the movement means and pushing a paste applied to the light emitting structure horizontally; and a roller connected to the movement means and rotatably-moving horizontally to thereby planarize the paste applied to the light emitting structure.

The pressure means and the roller may be positioned at different heights from the light emitting structure when the pressure means and the roller move horizontally by the movement means.

The roller may include prominences and depressions formed on a surface thereof. In this case, the prominences and depressions formed on the surface of the roller may have a size of several nanometers (nm) to several micrometers (μm).

A radius r of the roller may satisfy $$r \geq \frac{l}{2\pi},$$

provided that a radius of the roller is r and a maximum width of an upper surface of the light emitting structure to which the paste is applied is l.

The paste application apparatus may further include a paste supplying means provided under the movement means.

The paste application apparatus may further include a mask disposed on the light emitting structure and including an opening defining a paste application area.

The pressure means may be a squeegee pushing the paste horizontally.

BRIEF DESCRIPTION OF THE DRAWINGS

The above and other aspects, features and other advantages of the present invention will be more clearly understood from the following detailed description taken in conjunction with the accompanying drawings, in which:

FIGS. 1 through 3A, 4A and 5A are diagrams schematically illustrating a method of manufacturing a semiconductor light emitting device according to an embodiment of the present invention;

DETAILED DESCRIPTION OF THE INVENTION

Figure 1:
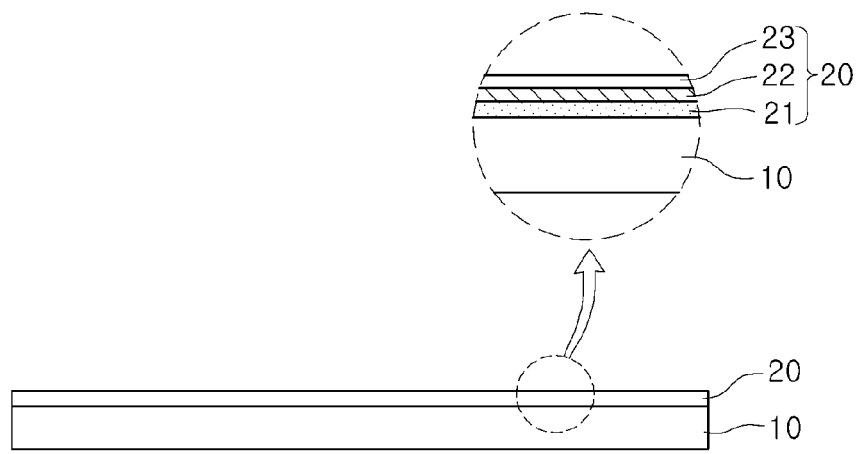

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and sizes of components are exaggerated for clarity. The same or equivalent elements are referred to by the same reference numerals throughout the specification.

FIGS. 1 through 3A, 4A and 5A are diagrams schematically illustrating a method of manufacturing a semiconductor light emitting device according to an embodiment of the present invention. The method of manufacturing a semiconductor light emitting device according to the embodiment of the present invention may include preparing a light emitting structure 20 including a first conductive semiconductor layer 21, an active layer 22, and a second conductive semiconductor layer 23; disposing a mask M including an opening exposing a part of the light emitting structure 20 on the light emitting structure 20; applying a paste 30 including a wavelength conversion material to the light emitting structure 20 through the opening of the mask M by using a pressure means S; and planarizing the applied paste 30 by using a roller.

First, as shown in FIG. 1, the light emitting structure 20 having the first conductive semiconductor layer 21, the active layer 22, and the second conductive semiconductor layer 23 sequentially stacked on a wafer 10 may be prepared. The first and second conductive semiconductor layers 21 and 23 may be an n-type semiconductor layer and a p-type semiconductor layer, respectively, and be formed of a nitride semiconductor. Thus, in the case of the embodiment of the present invention, first and second conductive types may refer to an n-type and a p-type, respectively; however, the present invention is not limited thereto. The first and second conductive semiconductor layers 21 and 23 may have a composition equation of $Al_xIn_yGa_{(1-x-y)}N$ (Here, $0 \leq x \leq 1$, $0 \leq y \leq 1$, $0 \leq x+y \leq 1$), and a material having such composition equation may be gallium nitride (GaN), aluminium gallium nitride (AlGaN), indium gallium nitride (InGaN) or the like, for example. The active layer 22 formed between the first and second conductive semiconductor layers 21 and 23 may emit light having a predetermined level of energy due to the recombination of electrons and electron holes and may be formed to have a multiple quantum well (MQW) structure having an alternately stacked quantum well layer and quantum barrier layer. As the multiple quantum well (MQW) structure, a structure of InGaN/GaN may be used.

Although not specifically illustrated, first and second electrodes (not shown), electrically connected to the first and second conductive semiconductor layers 21 and 23, may be formed on the light emitting structure 20. The first and second electrodes acting to supply the first and second conductive semiconductor layers 21 and 23 with an electrical signal applied from the outside and including one of gold (Au), nickel (Ni), aluminum (Al), cooper (Cu), tungsten (W), silicon (Si), selenium (Se) and gallium arsenide (GaAs), and may be formed by using a process, such as plating, sputtering, deposition or the like.

The wafer 10 may be a substrate for growing a semiconductor, and as the wafer 10, a substrate made of a material, such as sapphire, SiC, $MgAl_2O_4$, MgO, $LiAlO_2$, $LiGaO_2$, GaN, or the like may be used. In this case, sapphire, a crystal having Hexa-Rhombo R3c symmetry, has a lattice constant of 13.001 Å along a c-axis and a lattice constant of 4.758 Å along an a-axis and has a C(0001)-plane, an A(1120)-plane, an R(1102)-plane, or the like. In this case, since the C-plane may be relatively facilitated for the growth of a nitride thin film, and stable at high temperature conditions, the C-plane may be used mainly as a substrate for growing a nitride semiconductor. Although not illustrated, in order to alleviate lattice defects in the light emitting structure grown on the substrate, a buffer layer (not shown) including an un-doped semiconductor layer made of a nitride or the like may be interposed between the substrate and the light emitting structure. On an upper surface of the buffer layer, the light emitting structure 20 having sequentially stacked layers using a process of growing a semiconductor layer, such as metalorganic chemical vapor deposition (MOCVD), molecular beam epitaxy (MBE), hydride vapor phase epitaxy (HVPE), or the like, may be formed.

As in FIG. 1, the light emitting structure 20 having the first conductive semiconductor layer 21, the active layer 22, and the second conductive semiconductor layer 23 sequentially stacked on the wafer 10 for growing a semiconductor is illustrated; however, the light emitting structure 20 is not limited thereto. A structure in which the second conductive semiconductor layer 23, the active layer 22, and the first conductive semiconductor layer 21 are sequentially stacked on a conductive substrate (not shown) may be used. The conductive substrate may act as a support supporting the light emitting structure 20 in a process, such as a laser lift off process or the like, for removing the wafer 10, that is, a substrate for growing a semiconductor. The conductive substrate may be made of a material including one of Au, Ni, Al, Cu, W, Si, Se, and GaAs, and may be formed of a silicon (Si) substrate doped with aluminum (Al), for example.

The conductive substrate (not shown) may be connected to the light emitting structure 20 through a conductive adhesive layer (not shown), and a eutectic metal material, such as AuSn maybe used, for example. After forming the conductive substrate on the light emitting structure 20, the wafer 10 for growing a semiconductor is removed through a process, such as a laser lift off or a chemical lift off process, or the like, by using the conductive substrate as a support, and then a process of applying a paste including a wavelength conversion material ('paste application process') to the first conductive semiconductor layer 21 exposed by the wafer 10 which has been removed therefrom may be undertaken. In this case, the conductive substrate may come into contact with the second conductive semiconductor layer 23, thereby functioning as the second electrode applying an electrical signal to the second conductive semiconductor layer 23. The first electrode may be formed on the first conductive semiconductor layer 21 of the light emitting structure 20.

Figure 2:
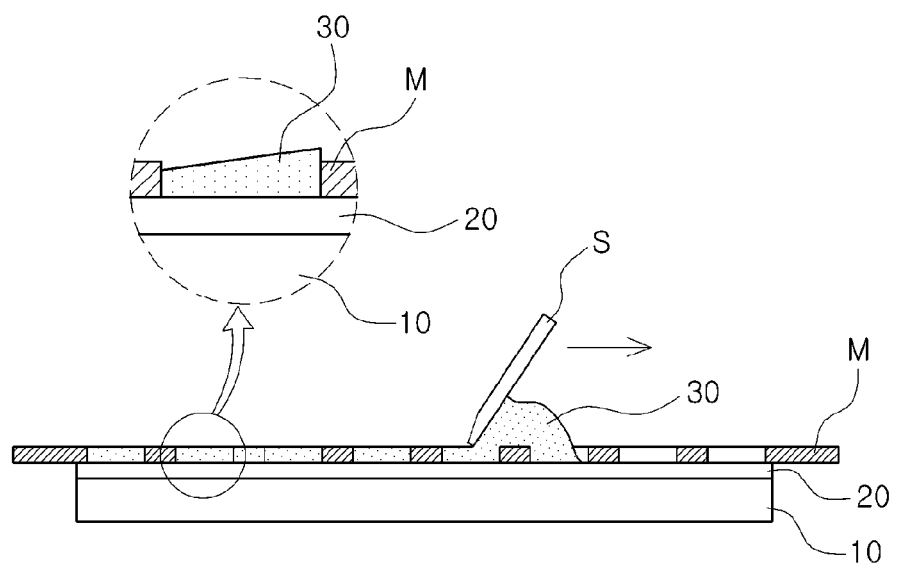

Next, as illustrated in FIG. 2, the mask M having an opening exposing a part of the light emitting structure may be disposed on the light emitting structure 20, and the paste 30 including a wavelength conversion material may be applied to the light emitting structure 20 through the opening of the mask M by using the pressure means S. In this case, in the process of applying the paste 30, a screen printing method may be used.

Referring to FIG. 2, the mask M used for screen printing is disposed on the light emitting structure 20 and the paste 30 including a wavelength conversion material may be squeezed on the mask M using the pressure means S. In this case, the pressure means S may be a squeegee pushing the paste 30 horizontally. The mask M for screen printing may be made of a metallic material or the like; however, it is not limited thereto, and may have an opening exposing a part of the light emitting structure 20. According to the squeezing process, the paste including a wavelength conversion material may be applied to an area of the light emitting structure 20 exposed by the opening of the mask M for screen printing. After the squeezing process, a process of curing the wavelength conversion material may be undertaken.

Although not limited thereto, the method of manufacturing a semiconductor light emitting device according to the embodiment of the present invention may be a process of manufacturing a plurality of semiconductor light emitting devices on a wafer, and the mask M for paste application may include a plurality of openings exposing unit device areas, to be formed through a separation of the light emitting structure 20. Thus, as illustrated in FIG. 2, through the plurality of openings of the mask M, the paste 30 may be applied to the unit device areas.

The wavelength conversion material included in the paste 30 may include fluorescent substance particles for wavelength conversion, the fluorescent substance particles converting a wavelength of light emitted from the active layer 22 of the light emitting structure 20. A fluorescent substance maybe a fluorescent material converting a wavelength of light into a yellow, red, or green wavelength, and the kinds of fluorescent substance may be determined based on a wavelength of light emitted from the active layer 22 of the light emitting structure 20. Specifically, the wavelength conversion material may be one of a YAG-based-, a TAG-based-, a silicate-based-, a sulfide-based-, and a nitride-based fluorescent materials. For example, when a fluorescent material converting a wavelength of light into a yellow wavelength is applied to a blue LED chip, a semiconductor light emitting device emitting white light may be obtained.

In addition, the wavelength conversion material may include quantum dots. The quantum dot, a nano crystal of a semiconductor material having a diameter of approximately 1~10 nm, maybe a material showing quantum confinement effects. The quantum dot may generate a wavelength conversion light, that is, fluorescence by converting a wavelength of light emitted from the light emitting structure 20. As the quantum dot, for example, a silicon (Si)-based nano crystal, a group II-VI based compound semiconductor nano crystal, a group III-V compound semiconductor nano crystal, a group IV-VI based compound semiconductor nano crystal, or the like, may be used alone or in a mixture thereof in the embodiment of the present invention.

The quantum dots may be dispersed while being naturally coordinated in a dispersion medium, such as an organic solvent or a polymer resin. As a dispersion medium of a wavelength conversion layer material, any transparent medium may be used, as long as it is not deteriorated due to light, does not reflect light, and does not cause light absorption while not affecting a wavelength conversion function of the quantum dots. For example, the organic solvent may include at least one of toluene, chloroform, and ethanol, and the polymer resin may include at least one of epoxy, silicone, polystyrene, and acrylate.

Referring to FIG. 2 again, when the paste 30 including a wavelength conversion material is applied to the light emitting structure 20 through the opening of the mask M by using the pressure means S, the paste 30 applied into the opening may have an inclined surface due to pressure exerted in a certain direction by the pressure means S. At the time of applying the paste 30 by using the pressure means S, the pressure means S, that is, the squeegee, repeatedly moves in opposing horizontal directions, such that a surface of the paste 30 maybe planarized. However, in this case, a surface of the mask M may be scratched due to the squeegee, and the paste 30 may be contaminated with mask constituents (metals, plastics or the like) detached from the mask M. In addition, the paste 30 applied into the opening of the mask M has an inclined surface, whereby the uniformity of light emitted from the light emitting structure 20 may be degraded.

Figure 3A:
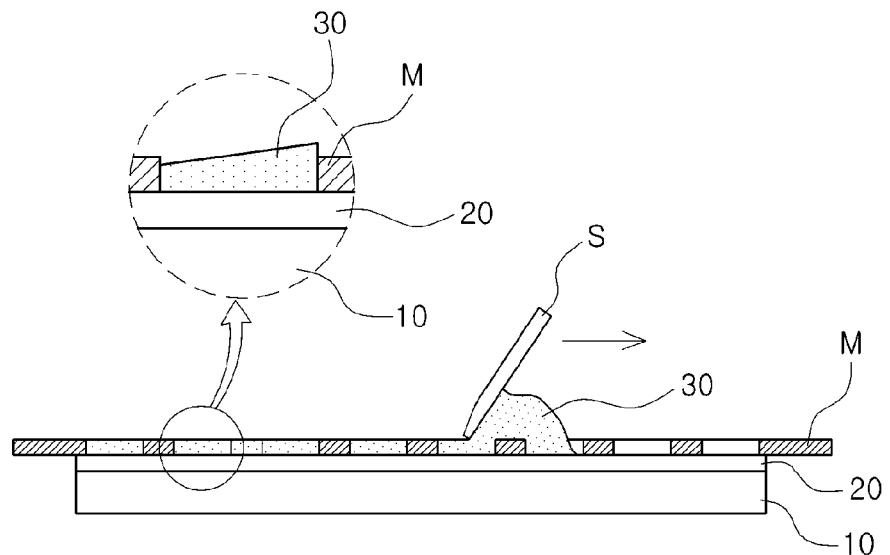

Thus, as shown in FIG. 3A, by using a roller R1 on the mask M having the paste 30 applied thereto, the surface of the paste 30 may be planarized to thereby allow for the solution of the above defects. The roller R1 may have a surface made of any one of rubber, metal, plastic, silicon, timber and paper. The roller R1 may move horizontally on the mask M having the paste 30 applied thereto, the inclined surface of the paste 30 may be planarized to thereby allow for improvements in the light uniformity of the semiconductor light emitting device. In the planarizing of the applied paste 30 using the roller R1, the roller R1 may moves in an opposite direction with respect to the moving direction of the pressure means S. For example, the pressure means S moves from the left of the mask M to the right thereof, and then the roller R1 moves from the right of the mask M to the left thereof, whereby the applied paste 30 may be effectively planarized.

Figure 3B:
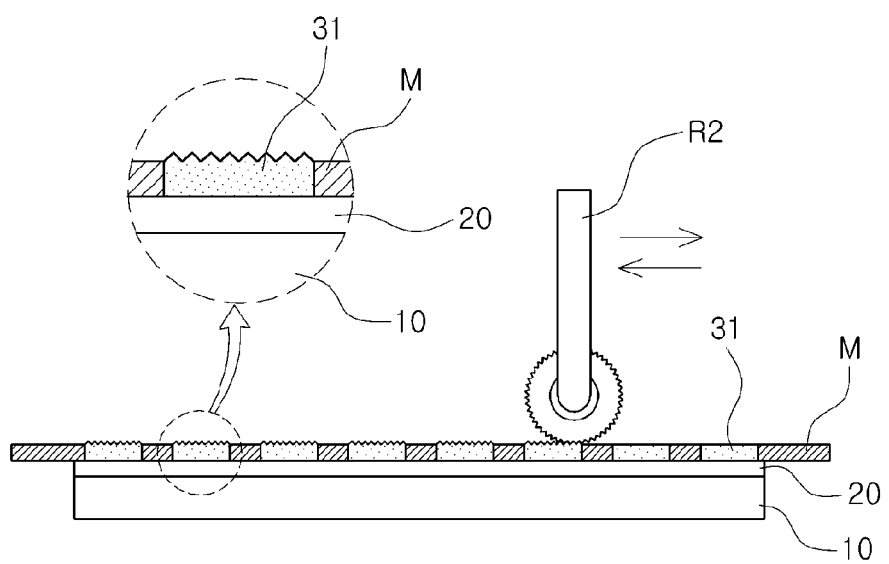
FIG. 3B is a diagram schematically illustrating a paste planarization process using a roller according to another embodiment of the present invention.

FIG. 3B is a diagram schematically illustrating a paste planarization process using a roller according to another embodiment of the present invention. Referring to FIG. 3B, a roller R2 according to the embodiment of the present invention may include prominences and depressions formed on a surface thereof, and in the planarizing of an applied paste 31, prominences and depressions may also be formed on the surface of the applied paste 31 by the prominences and depressions formed on the surface of the roller R2. The prominences and depressions formed on the surface of the roller R2 may be regularly or irregularly formed and have a size of several micrometers (μm) to several nanometers (nm).

In the embodiment of the present invention, the surface of the paste 31 applied to the light emitting structure 20 is planarized through the roller R2 having the prominences and depressions formed on the surface thereof to thereby secure light uniformity, and at the same time, the prominences and depressions are formed on the surface of the paste 31 to thereby allow for improvements in external light extraction efficiency of light emitted from the active layer 22 of the semiconductor light emitting device. Specifically, prominence and depression patterns are formed in a light path of the semiconductor light emitting device, whereby a total reflection ratio on a boundary surface between the semiconductor light emitting device and the outside may be reduced to thereby lead to improvements in external light extraction efficiency. In order to form the prominences and depressions, a simple method may be used in the process of planarizing the paste including a wavelength conversion material, rather than separately using a chemical, physical dry, or wet etching process, whereby processing efficiency may be improved.

Figure 3C:
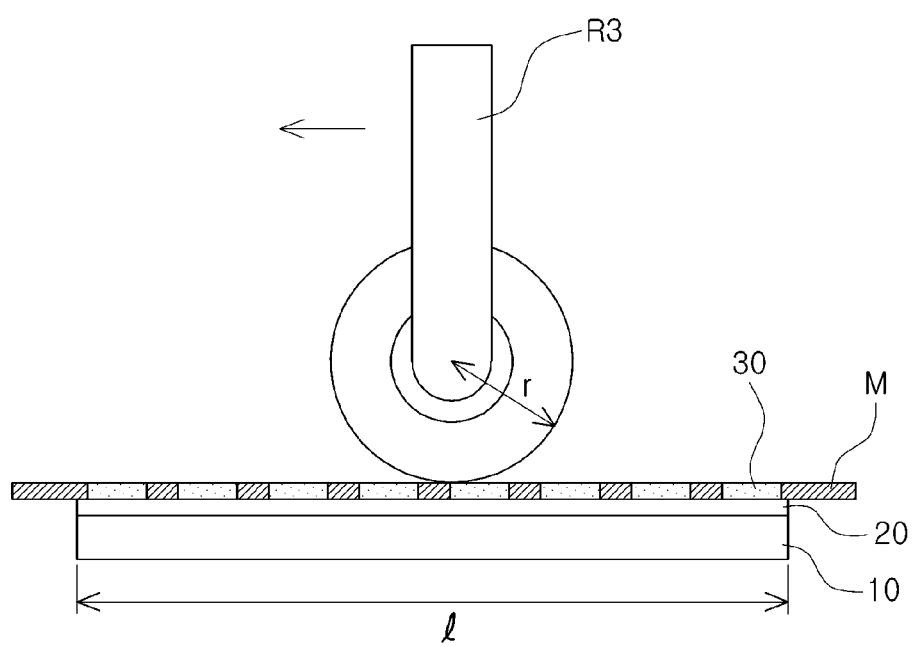
FIG. 3C is a diagram schematically illustrating a paste planarization process using a roller according to another embodiment of the present invention.

FIG. 3C is a diagram schematically illustrating a paste planarization process using a roller according to another embodiment of the present invention. According to the embodiment of the present invention, a radius r of a roller R3 for planarizing the applied paste 30 satisfies $$r \geq \frac{l}{2\pi},$$

provided that a maximum width (a diameter, in the case of a circular wafer) of the wafer 10 having the light emitting structure 20 formed thereon is 1, and a radius of the roller R3 is r. That is, a circumference (2πr) of the roller R3 may be larger than or identical to the maximum width of the wafer 10 or the light emitting structure 20. In this case, a surface of the roller R3 contacting the surface of the light emitting structure 20, may not contact the surface of the light emitting structure 20 again. According to the embodiment of the present invention, the roller R3 rotates once, such that the entirety of the surface of the light emitting structure 20 may be planarized. Accordingly, a defect of degradation in reliability generated by the re-contact of contaminants such as fluorescent substances remaining on the surface of the roller R3 with the surface of the light emitting structure 20 may be solved.

Figure 4A:
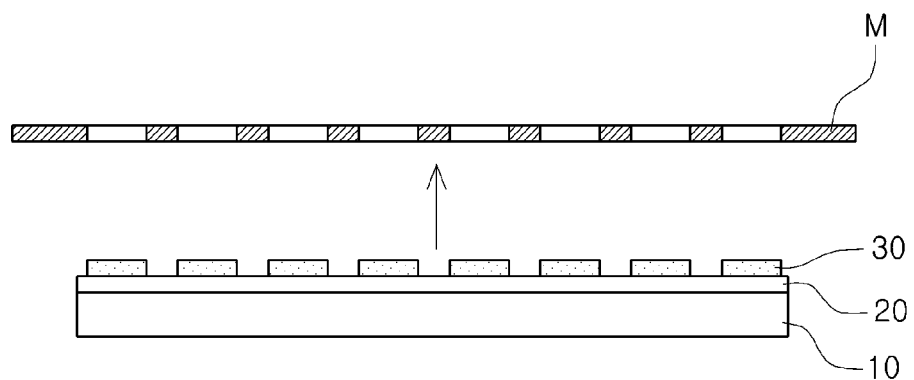

Next, referring to FIG. 4A, the mask M may be removed from the light emitting structure 20 having the paste 30 applied thereto, the paste including a wavelength conversion material. As illustrated in FIG. 4A, on the light emitting structure 20 from which the mask M has been removed, a wavelength conversion layer is formed in an area thereof corresponding to the opening of the mask M. In the embodiment of the present invention, the mask M may include a plurality of openings corresponding to the unit device areas of the light emitting structure 20, and by using the mask M including the plurality of openings, the wavelength conversion layer may be formed in the unit device areas of the light emitting structure 20. The embodiment of the present invention illustrates that the light emitting structure 20 is formed by sequentially stacking the first conductive semiconductor layer, the active layer, and the second conductive semiconductor layer on the wafer 10 for growing a semiconductor, and then the paste 30 is applied to the light emitting structure 20 having the mask M disposed on an upper surface thereof. Unlike this, as illustrated in FIG. 4B, the light emitting structure 20 is separated into the unit device areas thereof and then the application of a paste 30' including a wavelength conversion material may be performed.

Figure 4B:
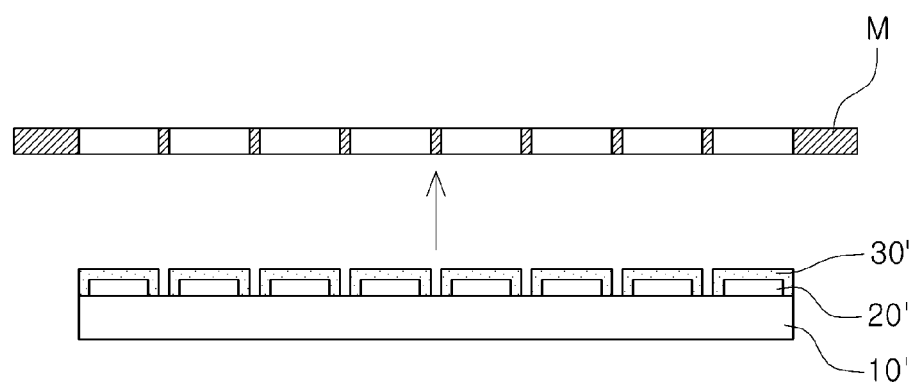
FIGS. 4B and 5B are diagrams respectively illustrating a part of a manufacturing process of a semiconductor light emitting device according to another embodiment of the present invention.

Specifically, in the embodiment of FIG. 4B, unlike the foregoing embodiment of FIG. 4A, after a light emitting structure 20' is formed by sequentially stacking the first conductive semiconductor layer, the active layer, and the second conductive semiconductor layer on a wafer 10' for growing a semiconductor, and is separated into unit device areas by removing a part thereof, a process of applying a paste 30' including a wavelength conversion material may be undertaken. The removing of a part of the light emitting structure 20' may be performed through a dry or wet etching process. Specifically, a dry etching process, for example, ICP-RIE (inductively coupled plasma-reactive ion etching), chemical etching, or the like, which uses fluorine-based gas such as $CF_4$, $SF_6$ or the like, chlorine-based gas such as $Cl_2$, $BCl_3$ or the like, or etching gas such as argon (Ar) or the like, may be used. Various wet etching processes using acid-or base-based chemical agents may be used. However, a unit device separation process may be not limited to these etching processes, and a polishing process, a cutting process or the like may be used.

Although not specifically illustrated, the unit device separation process may allow a part of the light emitting structure 20' or the wafer 10' to be removed. In this case, the positions of individual light emitting devices formed through the separation of the light emitting structure 20' are fixed due to the wafer 10', such that reliability in a subsequent process, for example, the paste application process, may be improved. According to the embodiment of the present invention, the paste 30' including a wavelength conversion material is exposed from sides of the light emitting devices separated and exposed through a subsequent process, such that wavelength-converted light may be emitted from the sides of the individual light emitting devices, as well as from upper surfaces thereof to allow for improvements in light uniformity.

Figure 5A:
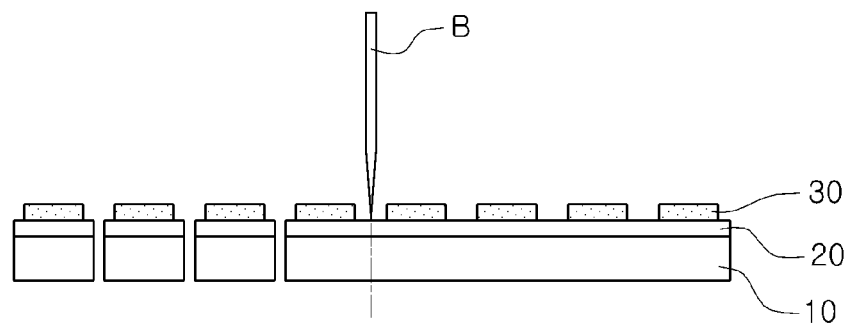
Figure 5B:
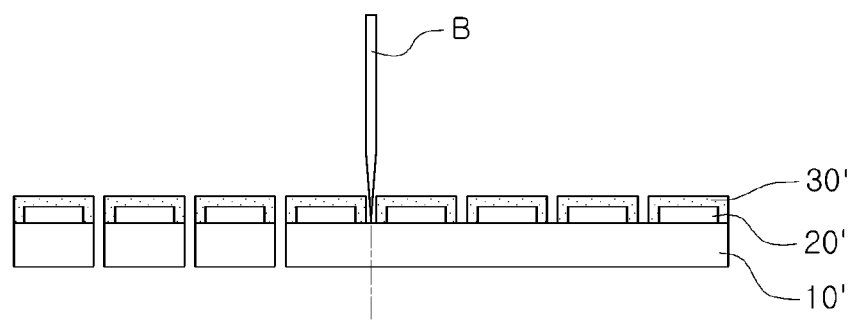

Next, as illustrated in FIG. 5A and 5B, the light emitting structures 20 and 20' respectively having the pastes 30 and 30' applied thereto and the wavelength conversion materials are separated into individual unit devices. In the case of FIG. 5B, the wavelength conversion layer maybe exposed from sides of the separated unit devices. In the unit device separation process, a cutting means such as a dicing blade B may be used. However, the present invention is not limited thereto, and a dicing, scribing, cutting, etching process or the like may be variously used. In the case of the embodiment, the application of the pastes 30 and 30' including wavelength conversion materials may be performed during the unit device separation process of separating the light emitting structures 20 and 20' respectively formed on the wafers 10 and 10' into the individual light emitting devices, whereby two processes may be integrated into a single process to thereby improve processing efficiency. In addition, a separate process of aligning the individual light emitting devices so as to perform the application of the pastes 30 and 30' may not be required, whereby distances between the individual light emitting devices may be controlled more precisely.

Figure 6:
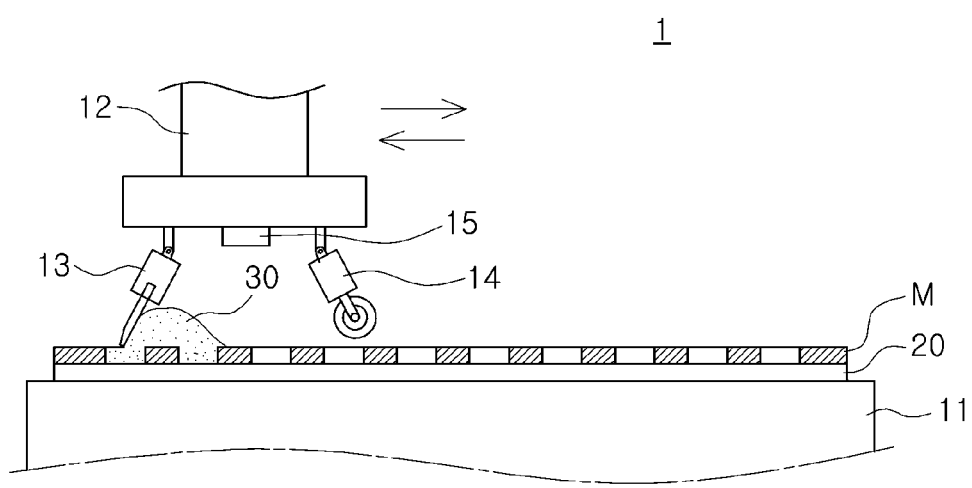
FIG. 6 is a diagram schematically illustrating a paste application apparatus according to an embodiment of the present invention.

FIG. 6 is a diagram schematically illustrating a paste application apparatus according to an embodiment of the present invention.

A paste application apparatus 1 according to the embodiment of the present invention may include a supporting means 11 having the light emitting structure 20 disposed on an upper surface thereof; a movement means 12 disposed above the supporting means 11 to be spaced apart therefrom and moving horizontally on the light emitting structure 20; a pressure means 13 formed under the movement means 12 and pushing the paste applied to the light emitting structure 20 disposed on the upper surface of the supporting means, horizontally; and a roller 14 disposed under the movement means 12 and planarizing the paste applied to the light emitting structure 20.

According to the embodiment of the present invention, the pressure means 13 and the roller 14 for applying the paste to the upper surface of the light emitting structure 20 are formed under the movement means 12 moving horizontally on the light emitting structure 20. Accordingly, when the movement means 12 moves horizontally on the light emitting structure 20, a process of compressing or planarizing the paste 30 applied to the light emitting structure 20 may be performed by one of the pressure means 13 and the roller 14. For example, when the movement means 12 moves from the left side to the right side, the pressure means 13 push the paste applied to the light emitting structure 20 horizontally, and when the movement means 12 which has moved to the right side moves from the right side to the left side, the roller 14 may planarize the paste 30 applied to the upper surface of the light emitting structure 20.

In this case, the pressure means 13 may be a squeegee pushing the paste 30 horizontally. Since one of the pressure means 13 and the roller 14 may be used on the paste 30 at the time of moving the movement means 12, the pressure means 13 and the roller 14 may be positioned at different heights from the light emitting structure 20 when the movement means 12 moves horizontally. That is, the heights of the pressure means 13 and the roller 14 from the movement means 12 may be controlled. For example, when the pressure means 13 is used on the paste 30, the roller 14 may be positioned so as to be spaced apart from the light emitting structure 20.

The roller 14 may have a surface made of any one of rubber, metal, plastic, silicon, timber and paper. Although not specifically illustrated, prominences and depressions may be formed on the surface of the roller 14. By the prominences and depressions formed on the surface of the roller 14, prominences and depressions may also be formed on the surface of the paste 30 applied to the light emitting structure 20, that is, the surface of the wavelength conversion layer. The prominences and depressions formed on the surface of the roller 14 may have a size of several micrometers (μm) to several nanometers (nm), such that a total reflection ratio on a boundary surface between the light emitting structure 20 and the outside may be reduced to thereby lead to improvements in external light extraction efficiency.

Meanwhile, a radius r of the roller 14 may satisfy $$r \geq \frac{l}{2\pi},$$

provided that a radius of the roller 14 is r and a maximum width of the upper surface of the light emitting structure to which the paste is applied is l. In this case, as described above, since the entirety of the surface of the light emitting structure 20 may be planarized as the roller 14 rotates once, a degradation in reliability generated by the re-contact of contaminants such as fluorescent substances remaining on the surface of the roller 14 with the surface of the light emitting structure 20 may be solved.

The paste application apparatus 1 according to the embodiment of the present invention may further include a paste supplying means 15 provided under the movement means 12 and including an opening supplying the paste 30 to the light emitting structure 20. The paste supplying means 15 includes the opening through which the paste 30 is discharged, the opening being located toward an upper portion of the light emitting structure 20. The paste supplying means 15 may discharge an appropriate amount of the paste while moving horizontally due to the movement means 12, and may be configured to move vertically.

At the time of applying the paste 30 to the light emitting structure 20, the mask M having an opening which defines a paste application area may be disposed on the upper surface of the light emitting structure 20. In a case in which the applying of the paste 30 is performed in a wafer unit for manufacturing a plurality of light emitting devices, the mask M may include a plurality of openings formed in the unit device areas. After the applying of the paste 30 using the mask M is completed, the mask M may be upwardly transferred and separated from the light emitting structure 20. Unlike this, the supporting means 11 on which the light emitting structure 20 is disposed may be downwardly transferred, such that the light emitting structure 20 having the paste 30 applied thereto may be separated from the mask M.

Figure 7:
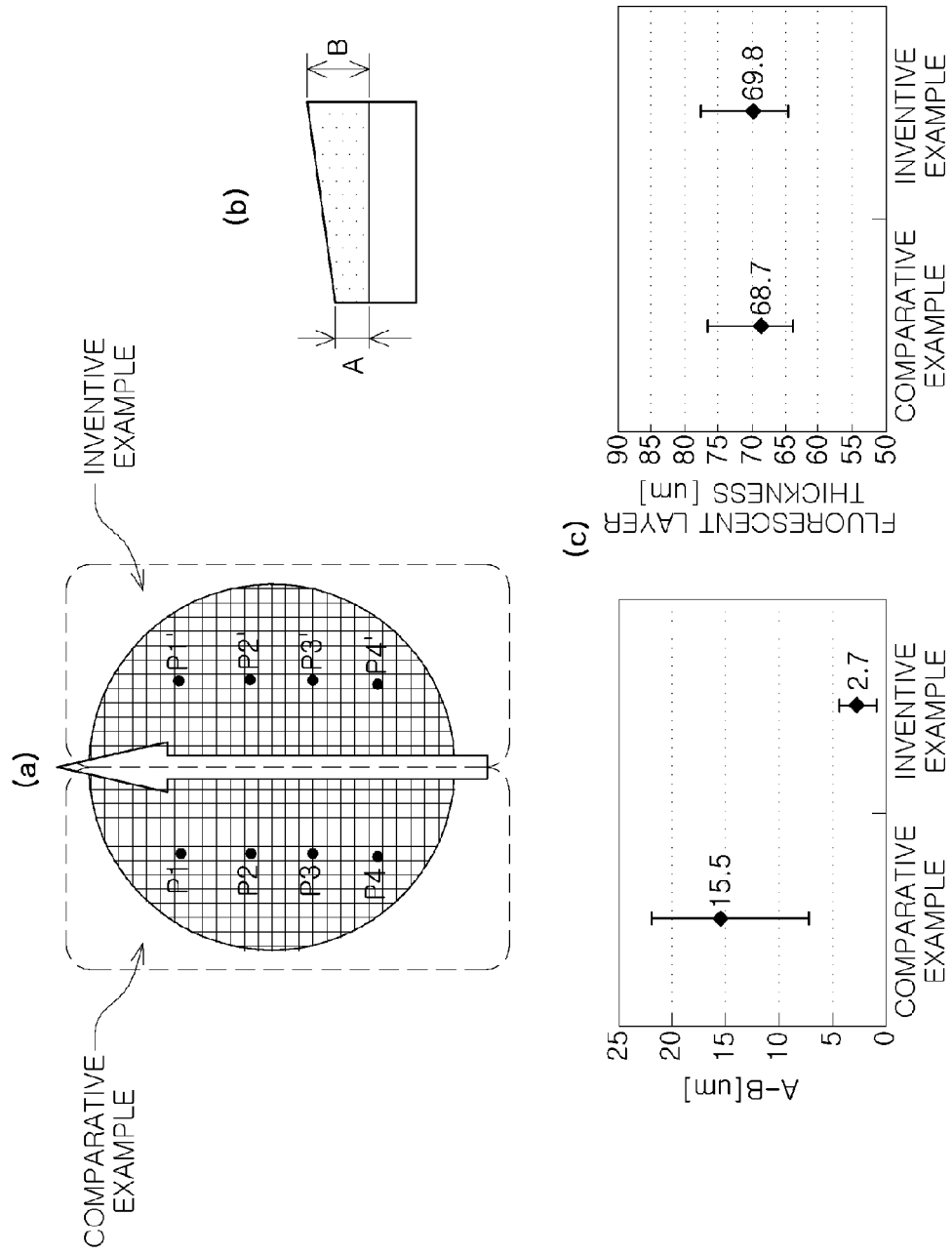
FIGS. 7A, 7B and 7C are diagrams for illustrating a degree of flatness of an applied paste according to an embodiment of the present invention.

FIGS. 7A, 7B and 7C are diagrams for illustrating the degree of flatness of an applied paste according to an embodiment of the present invention. Specifically, FIG. 7A is a diagram showing a wafer in which a paste including a wavelength conversion material is applied to a light emitting structure, when view above. In FIG. 7A, the left of the wafer illustrates a state in which a roller is not used (Comparative Example). The right of the wafer illustrates a state in which a roller is used on an upper surface of a light emitting structure having a paste applied thereto through a pressure means (Inventive Example). FIG. 7C illustrates the degrees of flatness A-B and fluorescent layer (wavelength conversion layer) thicknesses in respective points P1~P4 and P1'~P4' of the wafer shown in FIG. 7A. In FIG. 7C, a graph indicated by A-B (um) refers to differences A-B between A and B. That is, differences between a maximum value and a minimum value of wavelength conversion layer thicknesses in respective points P1~P4 and P1'~P4' of the wafer shown in FIG. 7A were measured, and in this case, it can be understood that as the differences are closer to 0, the degrees of flatness are high.

Referring to FIG. 7C, in the case of the Comparative Example in which the roller is not used, a distribution range of the difference A-B was broadened, as compared to the case of the inventive Example. An average value of the difference A-B in the Comparative Example was 15.5 um which significantly larger than an average value of 2.7 um in the inventive Example. Meanwhile, as for the fluorescent layer (wavelength conversion layer) thicknesses, the Comparative Example and the Example indicated similar average values. Thus, it can be seen that the use of the roller does not affect the fluorescent layer (wavelength conversion layer) thicknesses.

Figure 8:
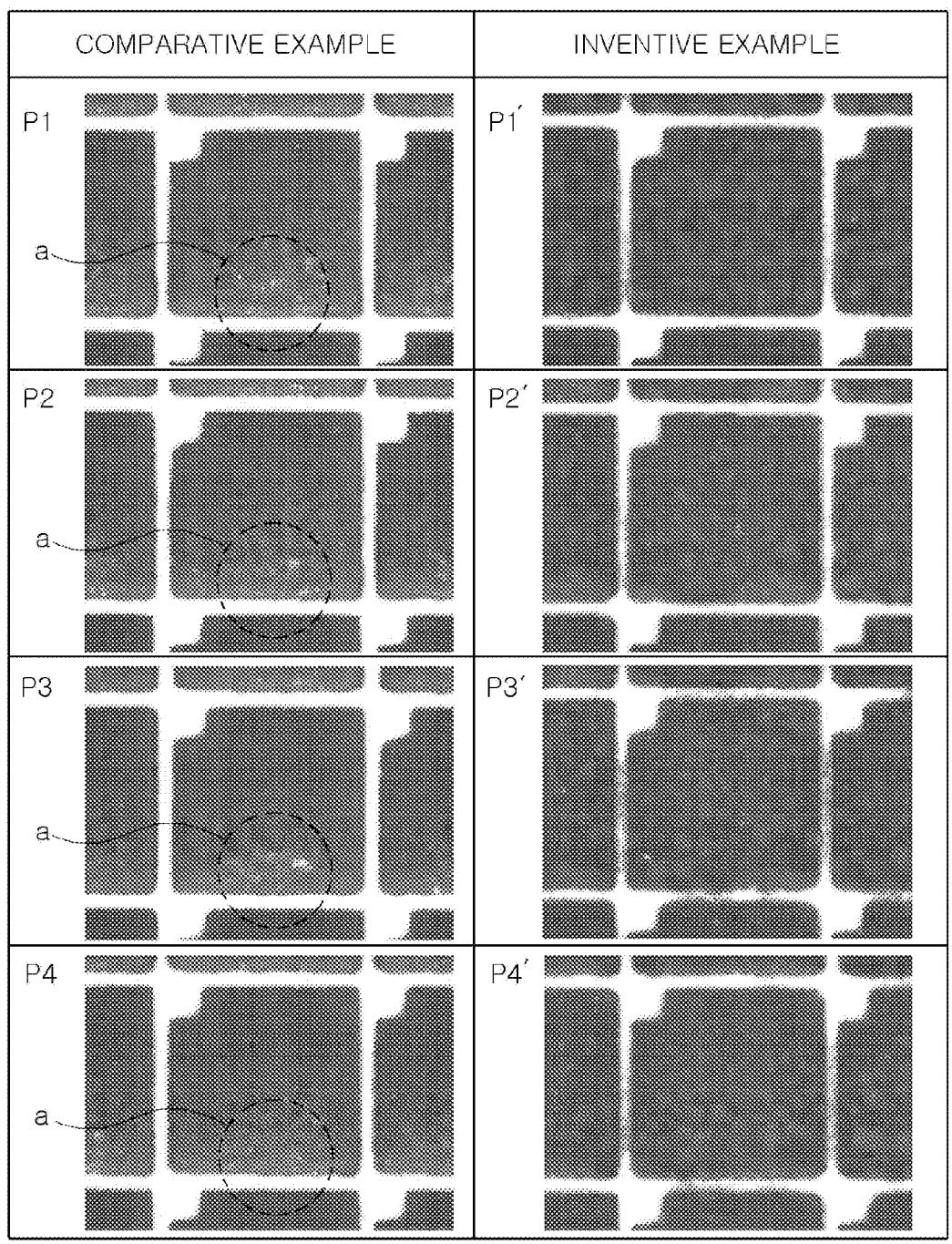
FIG. 8 is a photograph of a light emitting structure backlight photographed from respective positions P1~P4 and P1'~P4' of FIG. 7A, when viewed from above.

FIG. 8 is a photograph of a light emitting structure backlight-photographed from respective positions P1~P4 and P1'~P4' of FIG. 7A, when viewed above. Referring to FIG. 8, in the case of the Comparative Example in which the roller is not used, due to the uneven application of the paste including a wavelength conversion material, it was seen that a partial area (a) in each of four points P1, P2, P3, and P4 is brighter. Thus, a defect in which light uniformity of the light emitting device is degraded may be generated. On the other hand, in the case of the Example in which a roller is used on an upper surface of a light emitting structure having a paste applied thereto through a pressure means, due to the even application of the paste, it can be seen that light was uniformly emitted from the overall areas.

As set forth above, according to embodiments of the invention, a method of manufacturing a semiconductor light emitting device having improved chromaticity and light uniformity due to improved reliability in a paste application process could be provided.

In addition, the applying of a paste including a wavelength conversion material is performed during a process of separating a light emitting structure formed on a wafer into individual unit chips, whereby two processes could be integrated into a single process to thereby allow for an improvement in processing efficiency.

A separate process of aligning individual light emitting devices in order to perform the applying of paste containing a wavelength conversion material is not required, whereby a distance between the light emitting devices could be more precisely controlled.

Furthermore, a paste application apparatus capable of manufacturing a semiconductor light emitting device having improved chromaticity and light uniformity due to improved reliability in the paste application process could be provided.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a semiconductor light emitting device, the method comprising:
   preparing a light emitting structure including a first conductive semiconductor layer, an active layer, and a second conductive semiconductor layer;
   disposing a mask including an opening exposing a part of the light emitting structure on the light emitting structure;
   applying a paste including a wavelength conversion material to the light emitting structure through the opening of the mask, by using a pressure means; and
   planarizing the applied paste by using a roller.

2. The method of claim 1, wherein in the applying of the paste, the pressure means is a squeegee pushing the paste horizontally.

3. The method of claim 1, wherein in the applying of the paste and the planarizing of the applied paste, the pressure means and the roller move horizontally on the light emitting structure in opposite directions.

4. The method of claim 1, wherein the roller includes prominences and depressions formed on a surface thereof, and in the planarizing of the applied paste, prominences and depressions are formed on a surface of the applied paste by the prominences and depressions formed on the surface of the roller.

5. The method of claim 4, wherein the prominences and depressions formed on the surface of the roller have a size of several nanometers (nm) to several micrometers (μm).

6. The method of claim 1, wherein a radius r of the roller satisfies $$r \geq \frac{l}{2\pi},$$

provided that a radius of the roller is r and a maximum width of an upper surface of the light emitting structure to which the paste is applied is l.

7. The method of claim 1, wherein the opening is provided in plural, and unit device areas formed by a separation of the light emitting structure are exposed through the plurality of openings.

8. The method of claim 1, wherein the applying of the paste is performed by a screen printing method.

9. The method of claim 1, further comprising forming the light emitting structure by sequentially stacking the first conductive semiconductor layer, the active layer, and the second conductive semiconductor layer on a wafer.

10. The method of claim 1, further comprising separating the light emitting structure into unit devices to generate a plurality of light emitting devices.

11. The method of claim 10, wherein the separating of the light emitting structure into unit devices to generate a plurality of light emitting devices, is performed before the applying of the paste or after the applying of the paste.

12. The method of claim 10, wherein the paste is exposed through sides of the plurality of light emitting devices generated by separating the light emitting structure into unit devices.

13. The method of claim 1, wherein the paste includes at least one of fluorescent substance particles and quantum dots.

* * * * *